(12) United States Patent
Tamaru et al.

(10) Patent No.: US 6,483,331 B2
(45) Date of Patent: Nov. 19, 2002

(54) TESTER FOR SEMICONDUCTOR DEVICE

(75) Inventors: Hiroyuki Tamaru, Yokohama; Mitsuo Fujii, Sambu-gun, both of (JP)

(73) Assignee: Kabushiki Kaisha Toshiba (JP)

(*) Notice: Subject to any disclaimer, the term of this patent is extended or adjusted under 35 U.S.C. 154(b) by 0 days.

(21) Appl. No.: 09/823,958

(22) Filed: Mar. 28, 2001

(65) Prior Publication Data
US 2001/0026168 A1 Oct. 4, 2001

(30) Foreign Application Priority Data
Mar. 28, 2000 (JP) .......................... 2000-088705
Mar. 23, 2001 (JP) .......................... 2001-086273

(51) Int. Cl.$^7$ .......................... G01R 31/02; G01R 31/28
(52) U.S. Cl. .......................... 324/754; 324/755; 324/765
(58) Field of Search .......................... 324/754, 755, 324/765, 760, 758, 763

(56) References Cited

U.S. PATENT DOCUMENTS 5,144,228 A * 9/1992 Sorna et al. ............... 324/754
6,160,705 A * 12/2000 Stearns et al. ............. 361/704
6,335,495 B1 * 1/2002 Farquhar et al. ........... 174/262

FOREIGN PATENT DOCUMENTS

JP          10-123208          5/1998

* cited by examiner

Primary Examiner—Ernest Karlsen
(74) Attorney, Agent, or Firm—Gray Cary Ware & Freidenrich LLP

(57) ABSTRACT

A connection portion having a plurality of pads is provided on a test board. On the connection portion, a plurality of anisotropic conductive sheets, the sheet for the power source and the sheet for grounding are provided in an alternate manner. The connection portion and the semiconductor device are connected via the anisotropic conductive sheet, the sheet for the power source and the sheet for grounding. When the pin arrangement of the semiconductor device is changed, the sheet for the power source and the sheet for the grounding are changed.

2 Claims, 11 Drawing Sheets

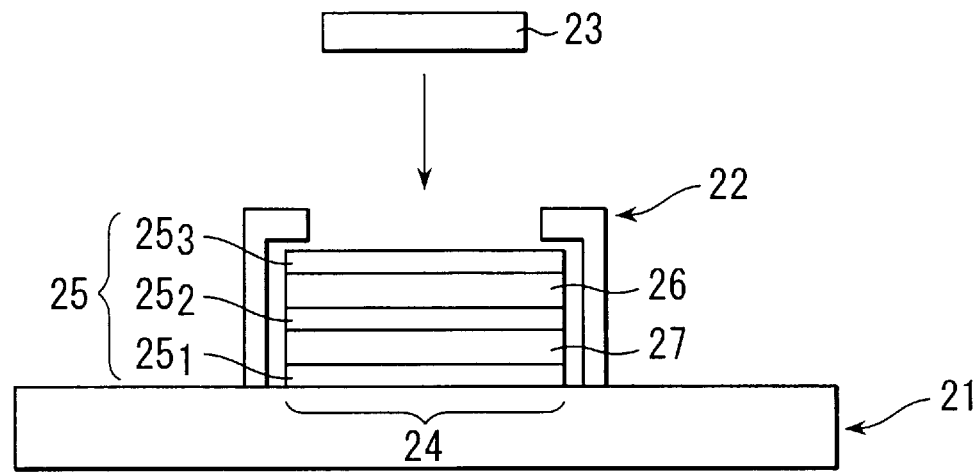
FIG. 1
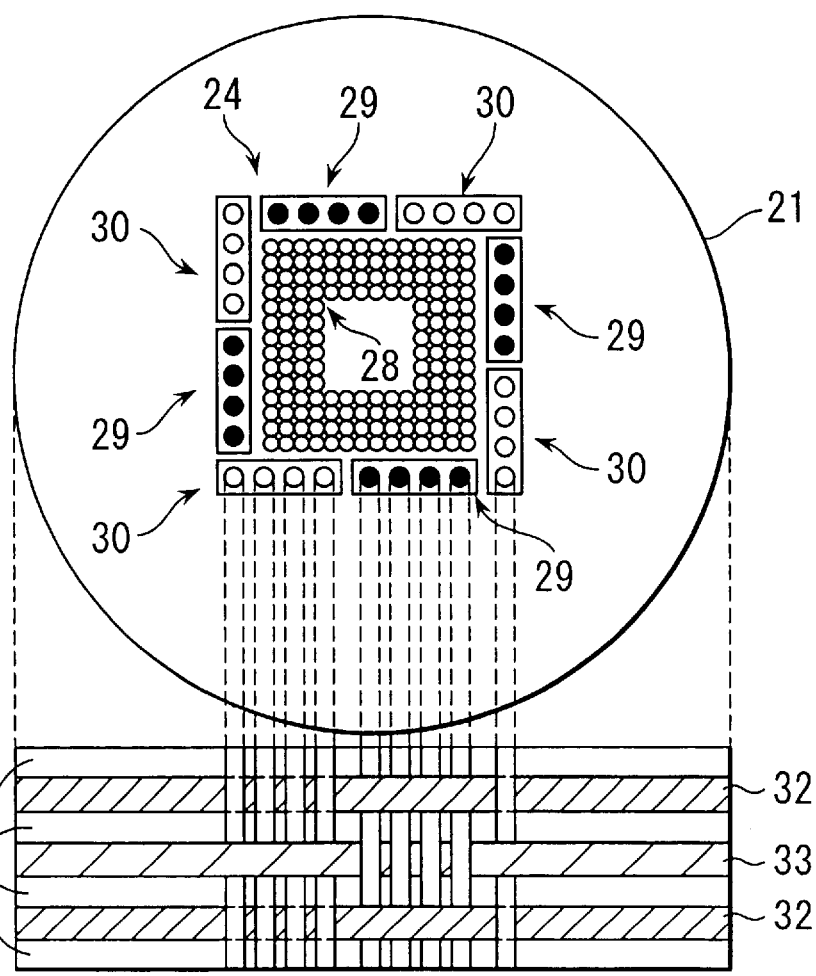
FIG. 2A
FIG. 2B

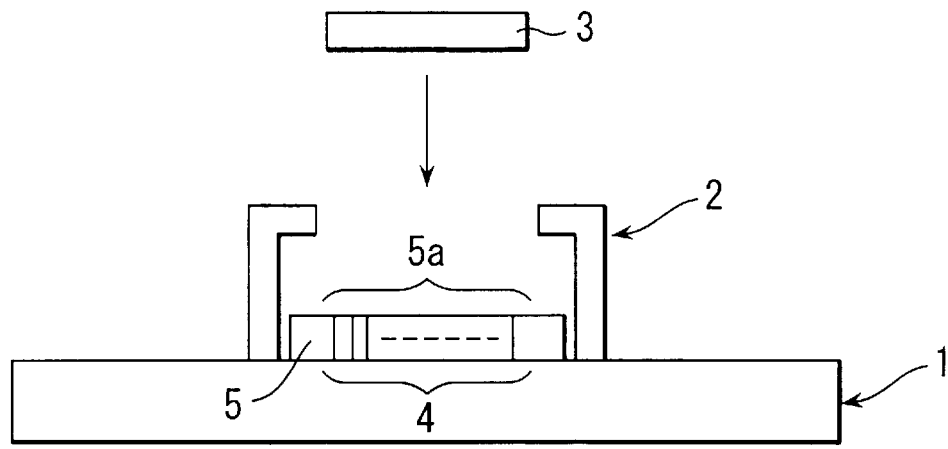
FIG. 16
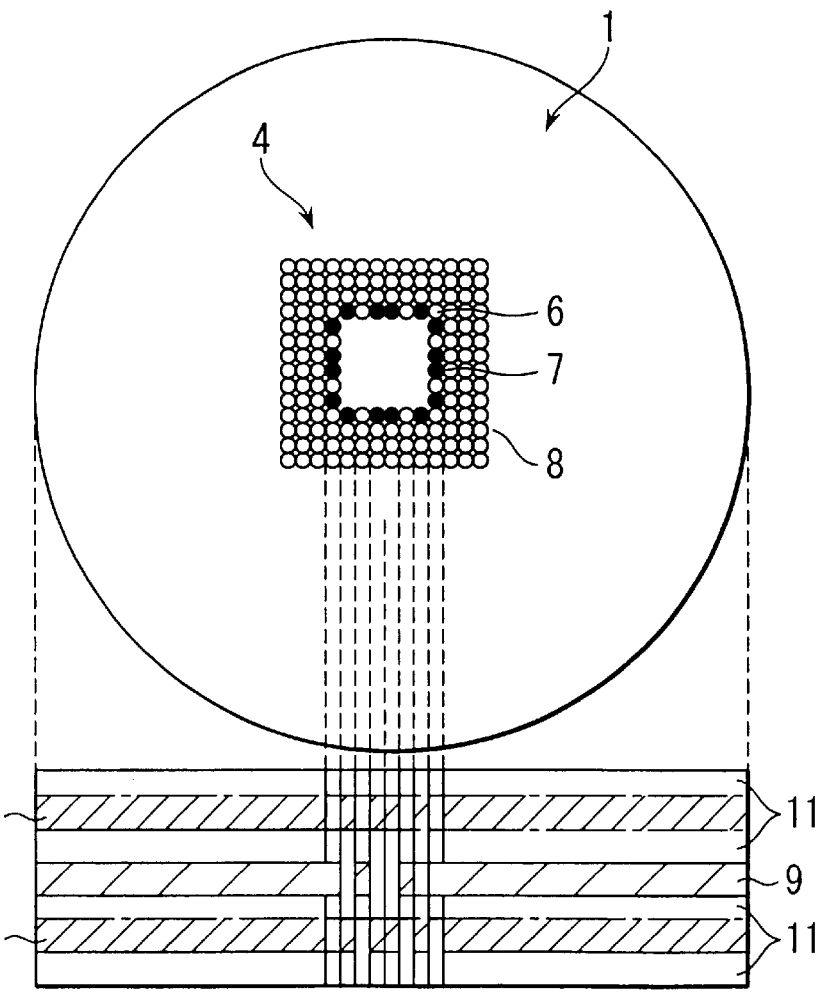
FIG. 17A
FIG. 17B

TESTER FOR SEMICONDUCTOR DEVICE

CROSS-REFERENCE TO RELATED APPLICATIONS

This application is based upon and claims the benefit of priority from the prior Japanese Patent Applications No. 2000-088705, filed Mar. 28, 2000; and No. 2001-086273, filed Mar. 23, 2001, the entire contents of both of which are incorporated herein by reference.

BACKGROUND OF THE INVENTION

The present invention relates to a tester for a semiconductor device for testing a semiconductor device which is generally assembled, for example, in a package.

Generally, in the case where a semiconductor device assembled in a package is tested, the semiconductor device is attached on a jig provided on a test board. In this state, the semiconductor device and a test board are electrically connected to test the semiconductor device.

FIG. 16 is a view showing a conventional first type test board. The test board 1 is provided with a socket 2. A semiconductor device 3 is attached on this socket 2. On the test board located inside of this socket 2, a connection portion 4 is provided which has a plurality of pads for connection. On this connection portion 4, an anisotropic conductive sheet 5 is arranged. The anisotropic conductive sheet 5 is constituted in such a manner that a plurality of metal fine lines 5a are arranged in correspondence to the pad, for example, in the insulating silicone rubber. One end of the metal fine line 5a is exposed to the surface of the insulating silicone rubber while the other end is exposed to the rear surface of the insulating silicone rubber.

FIGS. 17A and 17B are views showing a connection portion 4 provided on the test board 1. On the surface of the connection portion 4, a plurality of pads are provided. These pads are connected to pins for connection provided on the semiconductor device 3. In the case of this example, the semiconductor device to be measured is, for example, a pin grid array, or a ball grid array. On the surface of the connection portion 4, a plurality of power source pads 6, ground pads 7 and signal pads 8 are arranged. These power source pads 6, ground pads 7 and signal pads 8 are respectively connected to the power source layer 9, the ground wiring layer 10, and signal wiring layer 11 provided inside of the test board 1.

In the above structure, each pin of the semiconductor device 3 attached on the socket 2 is connected to the power source pads 6, the ground pads 7 and the signal pads 8 respectively via the anisotropic conductive sheet 5 so that a predetermined test is carried out in this state.

By the way, on the above first type test board, the power source pads 6, the ground pads 7 and the signal pads 8 provided on the connection portion 4 are arranged in correspondence to the locations of the power source pins and the ground pins determined for each of the semiconductor devices 3. Therefore, in the case where the positions of the power source pins and the ground pins of the semiconductor device to be measured do not coincide with the positions of these pads, it is required to manufacture a test board corresponding to the pins of the semiconductor device to be measured. As a consequence, a cost required for the test becomes high. Besides, since it is required to prepare a large number of dedicated test boards corresponding to the semiconductor device, a large space must be secured for conserving these test boards.

Furthermore, still two types of test boards are available as another embodiment. A second type test board is such that a socket to which the semiconductor device is attached is directly provided on the test board. On this socket, a contact connected to the semiconductor device is provided. This contact is electrically connected to the test board. In the case of the second type test board, there is a problem similar to the test board shown in FIGS. 16 and 17. That is, in the case where the power source pin and the ground pin of the semiconductor device as an object to be measured do not coincide with the position of the contact provided on the socket, it is required to prepare a test board corresponding to the pin of the semiconductor device to be measured. Consequently, the cost required for the test becomes high. Besides, since it is required to prepare a large number of dedicated test boards corresponding to the semiconductor device, a large space must be secured for conserving these test boards.

A third type test board has a first substrate and a second substrate as test boards, and a contact ring provided between the first and the second substrates. The first substrate has a plurality of electrode pads as a signal pad, a power source pad, and a ground pad. The second substrate has a socket on which the semiconductor device is attached on the surface thereof. On this socket, a plurality of contacts are provided which are connected to the semiconductor device. On the rear surface of the second substrate, a plurality of electrode pads are arranged which are electrically connected to each of the contacts. The contact ring has a pin comprising a plurality of conductive rubbers or conductive springs in the insulating substrate. One end of these pins is exposed to the surface of the contact ring while the other end thereof is exposed to the rear surface of the contact ring. The second substrate is electrically connected to the first substrate via the contact ring. That is, in the state in which the contact ring is arranged between the first substrate and the second substrate, the contact rings are attached and the first and the second substrates are pressed against the contact rings. In this state, the electrode pad arranged on the rear surface of the second substrate is connected to the electrode pad corresponding to the first substrate via the pin of the contact ring.

On the above third type test board, the second substrate is constituted of the insulating resin having a thickness of, for example, 3 mm. A plurality of conductive metals having a length equivalent to the thickness of the substrate is provided in the second substrate. One end of the conductive metal is connected to a contact in the socket while the other end thereof is connected to the electrode pad arranged on the rear surface of the second substrate. Furthermore, the contact ring is constituted of an insulating resin having a thickness of, for example, 12 mm. In this contact ring, a pin is provided which comprises a conductive rubber or a conductive spring having a thickness of, for example, 14 mm. Consequently, one and the other end of these pins are projected by 1 mm from the surface and the rear surface of the insulating substrate. In this manner, in the case of the third type test board, the pin of the semiconductor device is connected to the electrode pad of the first substrate via a long conductive metal and a pin, these long conductive metal and pins have a large impedance, particularly large inductance. Consequently, in the third type test board, transmission delay of signals is generated with this inductance so that it is difficult to conduct tests using a high-speed signal of tens of MHz or more.

BRIEF SUMMARY OF THE INVENTION

An object of the present invention is to provide a tester for a semiconductor device which can reduce cost required for the test of the semiconductor device and can decrease a space for conserving the test instrument, the tester being capable of testing the device at a high speed.

An object of the present invention can be attained by the following structure.

There is provided a tester for a semiconductor device, the apparatus comprising: a test board having a first electrode pad, a first power source pad and a second power source pad, the first electrode pad being arranged in correspondence to a signal pin of the semiconductor device, the first and the second power source pads being arranged in separation from the first electrode pad; a first intermediate board having a third power source pad, a fourth power source pad and a first hole, the third power source pad corresponding to the first power source pin of the semiconductor device, the fourth power source pad being electrically connected to the third power source pad and corresponding to the first power source pad of the test board, the first hole corresponding to the second power source pin of the semiconductor device; a second intermediate board having a fifth power source pad, a sixth power source pad and a second hole, the fifth power source pad being arranged between the first intermediate board and the test board and being in correspondence to the second power source pin of the semiconductor device, the sixth power source pad being electrically connected to the fifth power source pad and being in correspondence to the second power source pad of the test board, the second hole being in correspondence to the fourth power source pad of the first intermediate board; a first conductive sheet arranged mutually between the first intermediate board and the semiconductor device, the first conductive sheet electrically connecting the first power source pin of the semiconductor and the third power source pad of the first intermediate board; a second conductive sheet arranged between the first intermediate board and the second intermediate board, the second conductive sheet electrically connecting the second power source pin of the semiconductor device and the fifth power source pad of the second intermediate board via the first hole of the first intermediate board and the first conductive sheet; and a third conductive sheet arranged between the second intermediate board and the test board, the third conductive sheet electrically connecting the sixth power source pad of the second intermediate board and the second power source pad of the test board, and electrically connecting the fourth power source pad of the first intermediate board and the first power source pad of the test board via the second hole of the second intermediate board and the second conductive sheet.

Furthermore, the object of the present invention is attained with the following device.

There is provided a tester for a semiconductor device, the apparatus comprising: a test board having a first electrode pad, a first power source pad and a second power source pad, the first electrode pad being arranged in correspondence to a signal pin of the semiconductor device, the first power source pad and the second power source pad being arranged in separation from the first electrode pad, and an intermediate board having a third power source pad, a fourth power source pad, a fifth power source pad, and a sixth power source pad, the third power source pad corresponding to the first power source pin of the semiconductor device, the fourth power source pad being electrically connected to the third power source pad and corresponding to the first power source pad of the test board, the fifth power source pad corresponding to the second power source pin of the semiconductor device, the sixth power source pad being electrically connected to the fifth power source pad and corresponding to the second power source pad of the test board.

Furthermore, the object of the present invention is attained with the following device.

There is provided a tester for a semiconductor device, the apparatus comprising: an intermediate board having s first electrode pad, a second electrode pad and a test circuit, the first electrode pad being arranged in correspondence to a signal pin of the semiconductor device on a first surface of the intermediate board, the test circuit being electrically connected to the first electrode pad, the second electrode pad being arranged on a second surface on the opposite side of the first surface of the intermediate board and being electrically connected to the test circuit; a test board having a third electrode pad arranged in correspondence to the second electrode pad of the intermediate board; and a conductive sheet being arranged between the intermediate board and the test board, the conductive sheet electrically connecting the second electrode pad of the intermediate board and the third electrode pad of the test board.

Furthermore, an object of the present invention can be attained with the following device.

There is provided a tester for a semiconductor device, the apparatus comprising: a test board having a first electrode pad and a first power source pad, the first electrode pad being arranged in correspondence to a signal pin of the semiconductor device, the first power source pad being arranged in separation from the first electrode pad; and an intermediate board having a second power source pad, a third power source pad, a second electrode pad and a third electrode pad, the second power source pad being electrically connected to the power source pin of the semiconductor device, the third power source pad being electrically connected to the second power source pad and being connected to the first power source pad of the test board, the second electrode pad being connected to the signal pin of the semiconductor device, the third electrode pad being electrically connected to the second electrode pad and being connected to the first electrode pad of the test board.

According to the present invention, the cost required for the test of the semiconductor device can be decreased while a space for conserving the test instrument can be decreased. Furthermore, a high-speed test is made possible which can decrease the transmission delay of the signal.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a structure view showing a first embodiment of the present invention.

FIG. 2A is a plan view showing an essential part of FIG. 1, FIG. 2B is a cross sectional view showing a part of FIG. 2A.

FIG. 16 is a structure view showing one example of the conventional test board.

FIG. 17A is a plan view showing an essential part of FIG. 16, FIG. 17B is a cross sectional view showing a part of FIG. 17A.

DETAILED DESCRIPTION OF THE INVENTION

Figure 3:
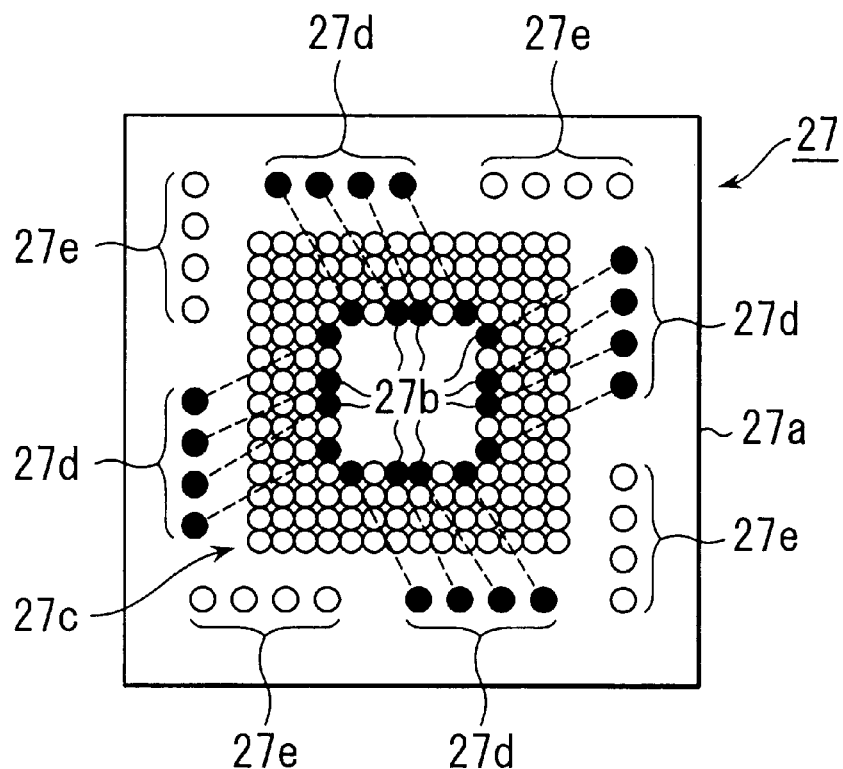
FIG. 3 is a plan view showing an essential part of FIG. 1.

Embodiments of the present invention will be explained hereinafter by referring to the drawings.

First Embodiment

FIG. 1 is a view showing a first embodiment of the present invention. On a test board 21, a socket 22 is provided and a semiconductor device 23 to be measured is attached on this socket 22. On the test board 21 located inside of the socket 22, a connection portion 24 having a plurality of pads not shown is provided. On this connection portion 24, a plurality of anisotropic conductive sheets 25 ($25_1$, $25_2$, and $25_3$), a sheet 26 for the power source, and a sheet 27 for grounding are alternately arranged. That is, on the connection portion 24, an anisotropic conductive sheet $25_1$ is provided. On the anisotropic conductive sheet $25_1$, the sheet 27 for grounding is provided. On the sheet 27 for grounding, the anisotropic conductive sheet $25_2$ is provided. The sheet 26 for the power source is provided on the anisotropic conductive sheet $25_2$. Furthermore, on the sheet 26 for the power source, an anisotropic conductive sheet $25_3$ is provided. On the anisotropic conductive sheet $25_3$, the semiconductor device 23 is attached.

FIGS. 2A and 2B are views showing a connection portion 24 provided on the test board 21. On the surface of the connection portion 24, a plurality of pads are provided which are connected to a pin for connection provided on the semiconductor device 23. In the case of this example, the semiconductor device to be measured is, for example, a pin grid array or a ball grid array. On the surface of this connection portion 24, a plurality of signal pads 28 are arranged. These signal pads 28 coincide with the arrangement of the plurality of pins provided on the semiconductor device 23. On the periphery of these signal pads 28, a plurality of ground pads 29 and a plurality of power source pads 30 are arranged. These signal pads 28, the ground pads 29, and the power source pads 30 are connected to the signal wiring layer 31, the ground wiring layer 32 and the power source wiring layer 33 provided inside the test board 21 respectively.

FIG. 3 is a view showing the sheet 27 for grounding. With respect to this sheet 27 for grounding, a plurality of electrode pads 27b are arranged in correspondence to the ground pin of the semiconductor device 23 on the central portion of the sheet 27a comprising an insulating material. On a portion other than the electrode pad 27b of the sheet 27a, a plurality of holes 27c are provided which correspond to the signal pin, the power source pin of the semiconductor device 23. Furthermore, on the periphery of these holes 27c, a plurality of ground pads 27d are provided which correspond to the ground pads 29 arranged on the connection portion 24 of the test board 21. These ground pads 27d are arranged on the surface and the rear surface of the sheet 27a. These ground pads 27d are provided in electrical connection to, for example, the surface and the rear surface of the sheet 27a. Theses ground pads 27d and the electrode pad 27b are electrically connected in a wiring pattern denoted by a broken line. Furthermore, on the periphery of the holes 27c, a plurality of holes 27e are provided in correspondence to the power source pad 30 arranged on the connection portion 24 of the test board 21.

Figure 4:
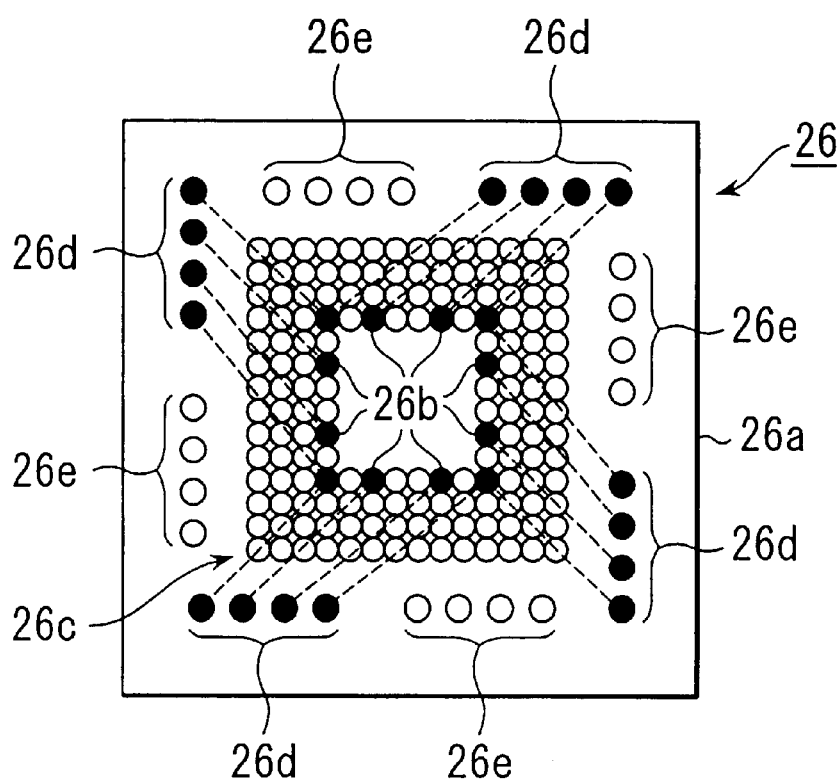
FIG. 4 is a plan view showing an essential part of FIG. 1.

FIG. 4 is a view showing a sheet 26 for the power source. On the sheet 26 for the power source, a plurality of electrode pads 26b are arranged in correspondence to the power source pin of the semiconductor device 23 on the central portion of the sheet 26a comprising an insulating material. On the portion other than the electrode pad 26b of the sheet 26a, a plurality of holes 26c are provided which correspond to the signal pin and the ground pin of the semiconductor device 23. Furthermore, on the periphery of these holes 26c, a plurality of power source pads 26d are provided in correspondence to the power source pad 30 arranged on the connection portion 24 of the test board 21. These power source pads 26d are provided in electrical connection to, for example, the surface and the rear surface of the sheet 26a. These power source pads 26d and the electrode pad 26b are electrically connected in a wiring pattern denoted by a broken line. Furthermore, on the periphery of the holes 26c, a plurality of holes 26e are provided in correspondence to the ground pad 29 arranged on the connection portion 24 of the test board 21.

Figure 5A:
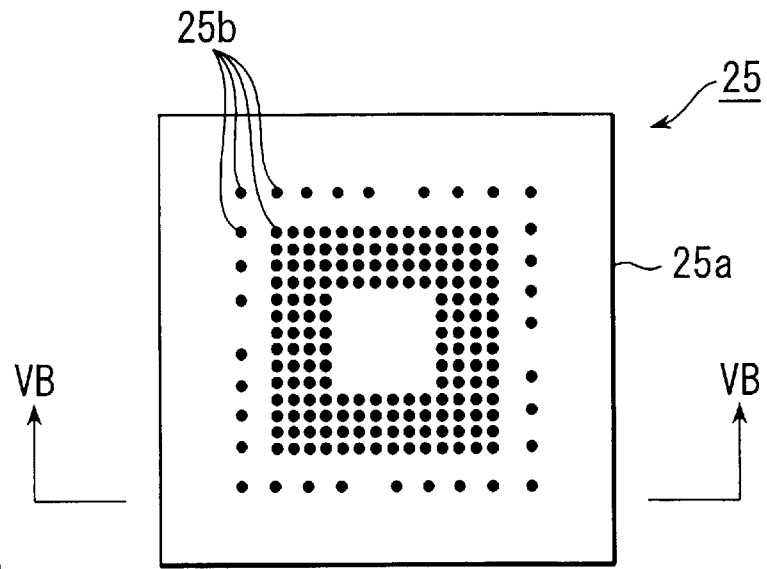
FIG. 5A is a plan view showing an essential part of FIG. 1.
Figure 5B:
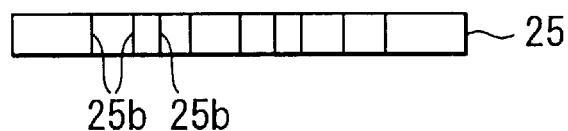
FIG. 5B is a sectional view taken along the line VB—VB of FIG. 5A.

FIGS. 5A and 5B are views showing the anisotropic conductive sheet 25. It is considered that the anisotropic conductive sheets $25_1$, $25_2$ and $25_3$ have the same structure. That is, with respect to the anisotropic conductive sheet 25, for example, a plurality of metal fine wires 25b are arranged inside of the insulating silicone-rubber-made sheet 25a with elasticity. These metal fine wires 25b correspond to the electrode pad 27b of the sheet 27 for grounding, the ground pad 27d, the electrode pad 26b for sheet 26 for the power source, the power source pad 26d and the signal pad for the semiconductor device 23. As shown in FIG. 5B, one end of the metal fine wire 25b is exposed to the surface of the sheet 25a while the other end thereof is exposed to the rear surface of the sheet 25a. Consequently, the metal fine wires 25b of the anisotropic conductive sheet 25 can be contacted to each pad of the pin of the semiconductor device 23, the sheet 26 for the power source, and the sheet 27 for grounding. Incidentally, on the anisotropic conductive sheet 25, when the metal fine wires 25b can be contacted to each pin and pad, the arrangement structure thereof is arbitrary.

In the above structure, in the case where the semiconductor device is tested, as shown in FIG. 1, the anisotropic conductive sheets $25_1$, $25_2$ and $25_3$ and the sheet 27 for grounding and the sheet 26 for the power source are accommodated one after another in the socket 22 so that the semiconductor device 23 is attached to the socket 22. This semiconductor device 23 is pressed in the direction of the test board 21, for example, with the press lid not shown. In this state, the connection channel of the power source pin of the semiconductor device 23 and the power source pad 30 in the connection portion 24 of the test board 21 are as follows.

In the beginning, the power source pin of the semiconductor device 23 is allowed to come into contact with the electrode pad 26b of the power source sheet 26 via the anisotropic conductive sheet $25_3$. The electrode pad 26b is connected to the power source pad 30 in the connection portion 24 via the power source pad 26d, the anisotropic conductive sheet $25_2$, the hole 27e of the sheet 27 for grounding, and the anisotropic conductive sheet $25_1$ respectively. The two anisotropic conductive sheets $25_2$ and $25_1$ located on both surfaces of the sheet 27 for grounding are mutually connected inside of the hole 27e of the sheet 27.

Furthermore, the connection channel of the ground pin of the semiconductor device 23 and the ground pad 29 at the connection portion 24 of the test board 21 is as follows.

In the beginning, the ground pin of the semiconductor device 23 is connected to the electrode pad 27b for the sheet 27 for grounding via the anisotropic conductive sheet $25_3$, the hole 26c of the sheet 26 for the power source, and the anisotropic conductive sheet $25_2$. Then, the electrode pad 27b is connected to the ground pad 29 in the connection portion 24 via the ground pad 27d and the anisotropic conductive sheet $25_1$, respectively.

Furthermore, the connection channel of the signal pin of the semiconductor device 23 and the signal pad 28 at the connection portion 24 of the test board 21 is as follows.

In the beginning, the signal pin of the semiconductor device 23 is connected to the signal pad 28 at the connection portion 24 via the anisotropic conductive sheet $25_3$, the hole 26c of the sheet 26 for the power source, the anisotropic conductive sheet $25_2$, the hole 27c of the sheet 27 for grounding and the anisotropic conductive sheet $25_1$.

According to the first embodiment, the signal pin, the ground pin and the power source pin of the semiconductor device 23 are connected to the signal pad 28, the ground pad 29, the power source pad 30 at the connection portion 24 in the test board 21 via the sheets 26 and 27 and the anisotropic conductive sheets $25_1$, $25_2$ and $25_3$. The ground pad 29 and the power source pad 30 of the connection portion 24 are arranged on the periphery of the signal pad 28. On the power source sheet 26, the electrode pad 26b connected to the power source pin of the semiconductor device 23, and the power source pad 26d connected to the electrode pad 26b and corresponding to the power source pad 30 of the connection portion 24 are provided. On the sheet 27 for grounding, the electrode pad 27b connected to the ground pin of the semiconductor device 23 and the ground pad 27d connected to the electrode pad 27b and corresponding to the ground pad 29 of the connection portion 24 are provided. As a consequence, in the case where the pin arrangement of the semiconductor device to be measured changes, the device can correspond to such change only by the change of the sheets 26 and 27. Consequently, the cost can be largely decreased as compared with the case in which a test board dedicated to use in the semiconductor device is manufactured, like the prior art.

In addition, since the sheet 26 for the power source and the sheet 27 for grounding are small in size as compared with the test board, a conservation space can be reduced.

Besides, the sheet 26 for the power source, the sheet 27 for grounding and the anisotropic conductive sheets $25_1$, $25_2$ and $25_3$ have an extremely thin thickness. Thus, the impedance of these sheets, particularly, the inductance thereof can be minimized. Consequently, since the transmission delay of the signal can be decreased, the high-speed test can be enabled.

Incidentally, in the first embodiment, it is possible to omit the anisotropic conductive sheets $25_1$, $25_2$ and $25_3$ when an electric contact is enabled mutually between the connection portion 24 of the test board 21, the semiconductor device 23, the sheet 26 for the power source, and the sheet 27 for grounding.

Second Embodiment

Figure 6:
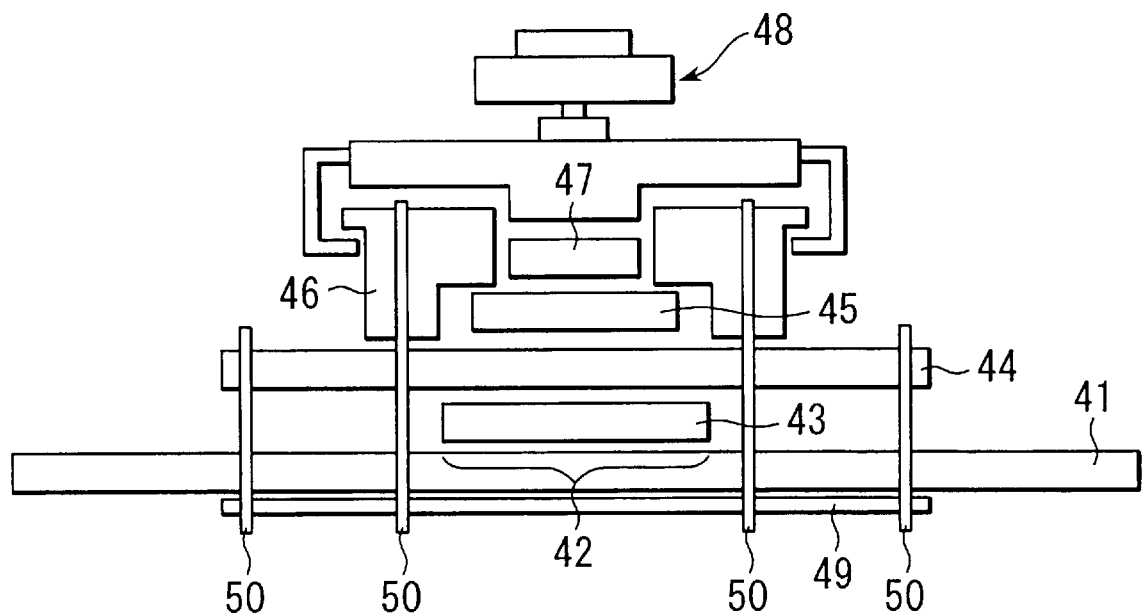
FIG. 6 is a structure view showing a second embodiment of the present invention.

FIG. 6 is a view showing a second embodiment of the present invention. In the first embodiment, the sheet for the power source and the sheet for grounding are used. On the other hand, in the second embodiment, for example, one of the power pad and the ground pad is used on the printed board.

In FIG. 6, the test board 41 has a connection portion 42. As will be described later, a signal pad arranged in correspondence to the signal pin of the semiconductor device, the power source pad and the ground pad arranged so as to be located at a position which does not depend upon the arrangement of the power source pin and the ground pin of the semiconductor device are provided on the connection portion 42. On this connection portion 24, the anisotropic conductive sheet 43 is provided. A contact board 44 is provided as an intermediate board on the anisotropic conductive sheet 43. As described later, this contact board 44 is provided with the electrode pad arranged in accordance with the power source pin and the ground pin of the semiconductor device to be measured, a power source pad and a ground pad arranged at a position which are connected to the electrode pad, and do not depend on the position of the signal pad, the power source pin and the ground pin of the semiconductor device. On the contact board 44, an anisotropic conductive sheet 45 is provided. This anisotropic conductive sheet 45 is arranged inside of the socket 46 provided on the contact board 44. The semiconductor device 47 is accommodated in this socket 46. Furthermore, in this socket 46, a lid body 48 is detachably attached. With this lid body 48, the semiconductor device 47 is pressed in a direction of the anisotropic conductive sheet 45. The test board 41, the contact board 44, and the socket 46 are fixed with a reinforcement plate 49 provided on the rear surface of the test board 41 and a plurality of shafts 50.

Figure 7A:
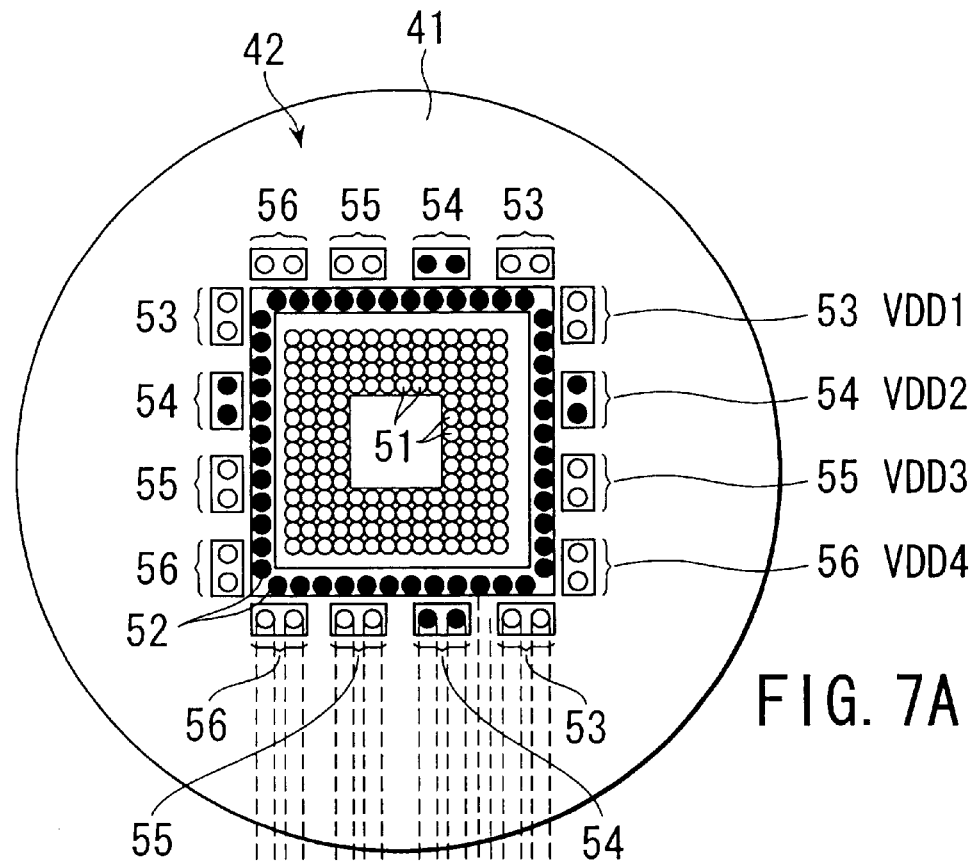
FIG. 7A is a plan view showing an essential part of FIG. 6.
Figure 7B:
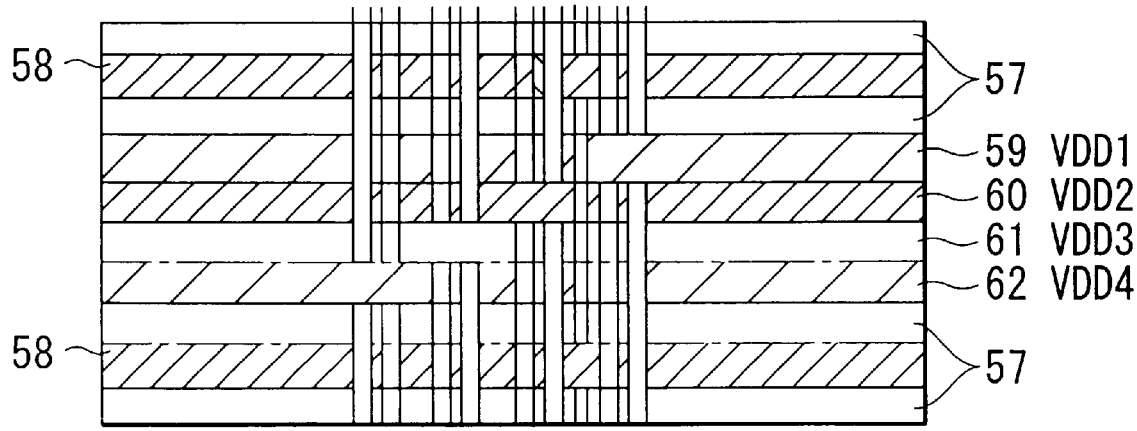
FIG. 7B is a cross sectional view showing a part of FIG. 7A.

FIGS. 7A and 7B are views showing a connection portion 42 provided on the test board 41. On the surface of the connection portion 42, a plurality of pads are provided. These pads are connected to a plurality of pins provided on the semiconductor device 47. In the case of the embodiment, the semiconductor device to be measured is, for example, a pin grid array and a ball grid array. On the surface of the connection portion 42, a plurality of signal pads 51 are arranged. These signal pads 51 coincide with the arrangement of the plurality of pins provided on the semiconductor device 47. On the periphery of these signal pads 51, a plurality of ground pads 52 are arranged. On the periphery of these ground pads 52, a plurality of power source pads 53, 54, 55 and 56 are arranged. In the case of the second embodiment, the power source pads 53 through 56 are allowed to correspond to a plurality of power sources VDD1 through VDD4, respectively.

The signal pads 51, the ground pads 52, the power source pads 53 through 56 are connected to the signal wiring layer 57, the ground wiring layer 58 and the power source wiring layer 59 through 62, respectively.

Figure 8A:
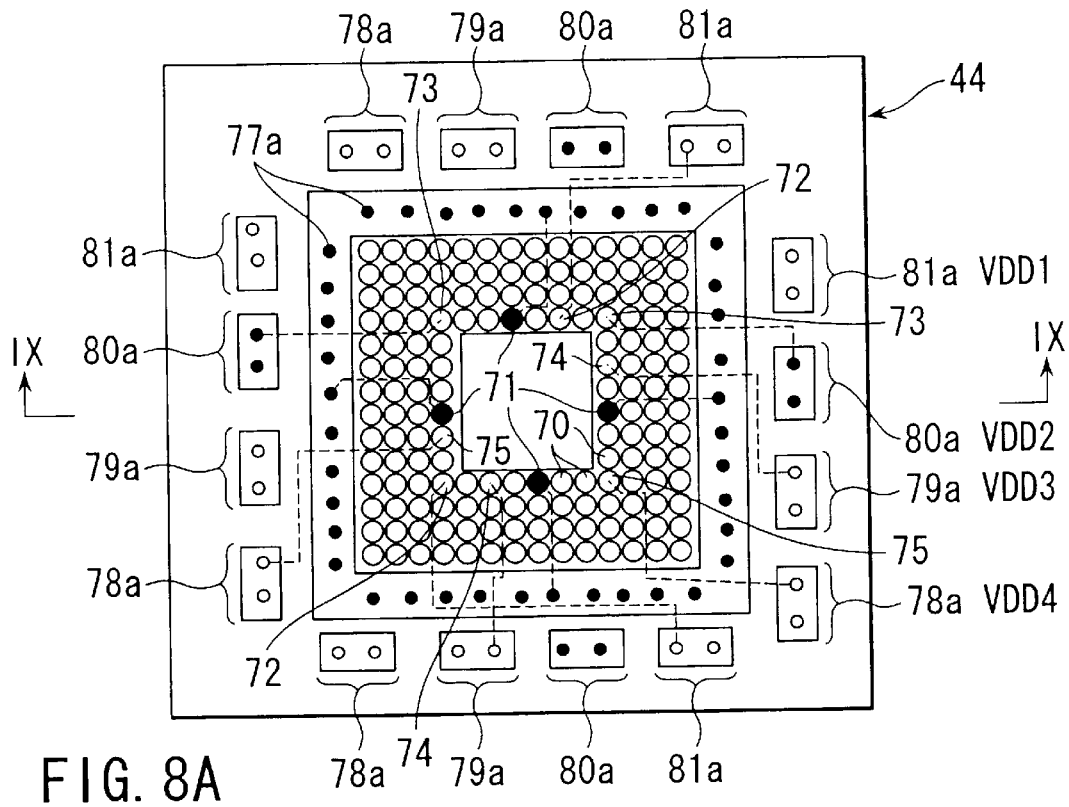
FIG. 8A is a plan view showing a surface of a contact board shown in FIG. 6.
Figure 8B:
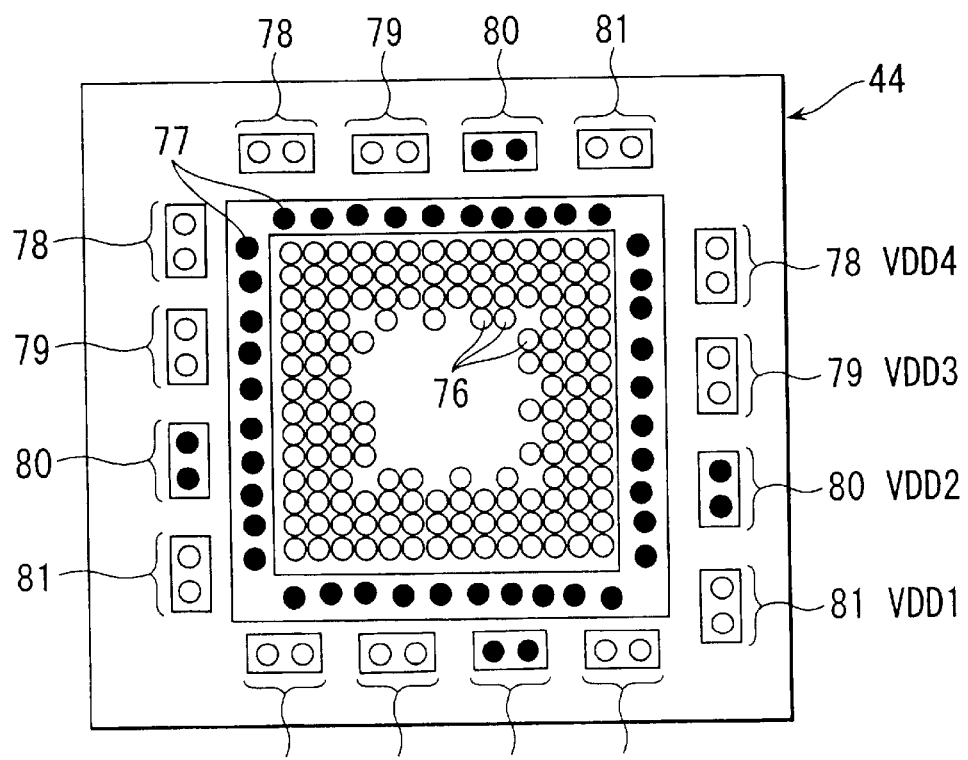
FIG. 8B is a plan view showing a rear surface of a contact board shown in FIG. 6.

FIG. 8A is a view showing a surface of the contact board 44. FIG. 8B is a view showing a rear surface of the contact board 44. On the central portion of the surface of the contact board 44, a plurality of electrode pads 71 are arranged in correspondence to the ground pins of the semiconductor device 47. In the vicinity of these electrode pads 71, electrode pads 72, 73, 74 and 75 corresponding to the pins of the semiconductor device 47 are arranged. On a portion other than the electrode pads 71 through 75 on the surface of the contact board 44, a plurality of electrode pads 70 corresponding to the signal pins of the semiconductor device 47 are provided.

Furthermore, as shown in FIG. 8B, on the rear surface of the contact board 44, a plurality of signal pads 76 are arranged approximately in correspondence to the electrode pads 70. These signal pads 76 correspond to the plurality of signal pads 51 arranged on the connection portion 42 of the test board 41. Inside of the contact board 44, these signal pads 76 are electrically connected to the plurality of electrode pads 70 arranged on the surface of the contact board 44.

Besides, on the periphery of the signal pad 76 on the rear surface of the contact board 44, a plurality of ground pads 77 are provided. These ground pads 77 correspond to the plurality of ground pads 52 arranged on the connection portion 42 of the test board 41. Furthermore, as shown in FIG. 8A, a plurality of ground 24 pads 77a are arranged on the periphery of the electrode pads 70 on the surface of the contact board 44. Corresponding one of the ground pads 77 and 77a is electrically connected to each other inside of the contact board 44.

Furthermore, as shown in FIG. 8B, on the periphery of the ground pad 77 on the rear surface of the contact board 44, a plurality of power source pads 81, 80, 79, and 78 are provided in correspondence to a plurality of the power source pads 53, 54, 55 and 56 arranged on the connection portion 42 of the test board 41. Furthermore, as shown in FIG. 8A, on the periphery of the ground pad 77a on the surface of the contact board 44, a plurality of power source pads 78a, 79a, 80a and 81a are provided in correspondence to the plurality of the power source pads 78, 79, 80, and 81. These power source pads 78a, 79a, 80a, and 81a are electrically connected to the corresponding power source pads 78, 79, 80 and 81.

The electrode pad 71 is connected to the ground pads 77 and 77a with a wiring pattern shown with a broken line. Furthermore, the electrode pads 72, 73, 74 and 75 are connected to a predetermined portion out of the power source pads 78a, 78, 79a, 79, 80a, 80, 81a and 81 with a wiring pattern shown with a broken line.

Figure 9A:
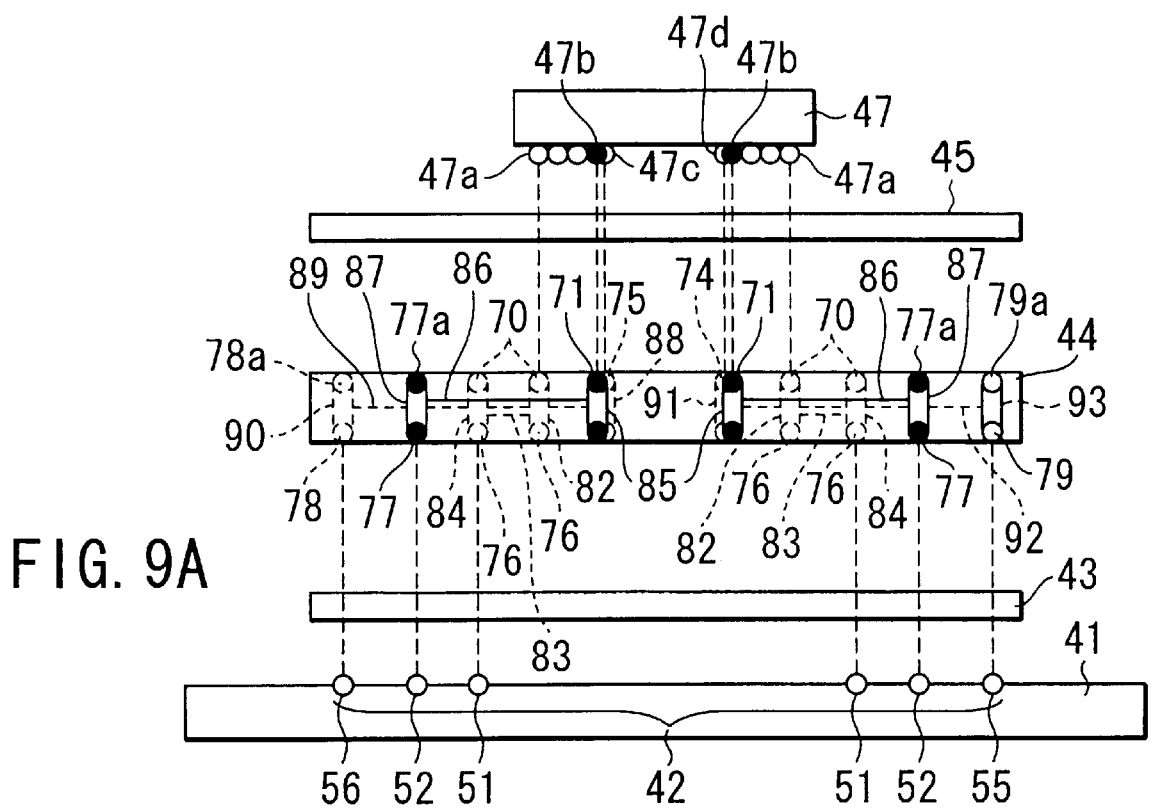
FIG. 9A is a view for schematically explaining a connection channel of the second embodiment.

FIG. 9A is a sectional view taken along the line IX—IX of FIG. 8A, the view schematically showing a connection channel from the semiconductor device 47 up to the test board 41. The signal pin 47a of the semiconductor device 47 is connected to the signal pad 51 of the connection portion 42 subsequently via the anisotropic conductive sheet 45, the electrode pad 70 of the contact board 44, a conductor 82 in a through-hole, a wiring pattern 83, a conductor 84 in the through-hole, a signal pad 76, and the anisotropic conductive sheet 43.

Furthermore, the ground pin 47b of the semiconductor device 47 is connected to the ground pad 52 of the connection portion 42 subsequently via the anisotropic conductive sheet 45, the electrode pad 71 of the contact board 44, a conductor 85 in the through-hole, a wiring pattern 86, a conductor 87 in the through-hole, a ground pad 77, and the anisotropic conductive sheet 43.

Furthermore, the power source pin 47c of the semiconductor device 47 is connected to the power source pad 56 of the connection portion 42 subsequently via the anisotropic conductive sheet 45, the electrode pad 75 of the contact board 44, a conductor 88 in the through-hole, a wiring pattern 89, a conductor 90 in the through-hole, the power source pad 78, and the anisotropic conductive sheet 43. Furthermore, the power source pin 47d of the semiconductor device 47 is connected to the power source pad 55 of the connection portion 42 subsequently via the anisotropic conductive sheet 45, the electrode pad 74 of the contact board 44, a conductor 91 in the through-hole, a wiring pattern 92, a conductor 93 in the through-hole, the power source pad 79, and the anisotropic conductive sheet 43.

Figure 9B:
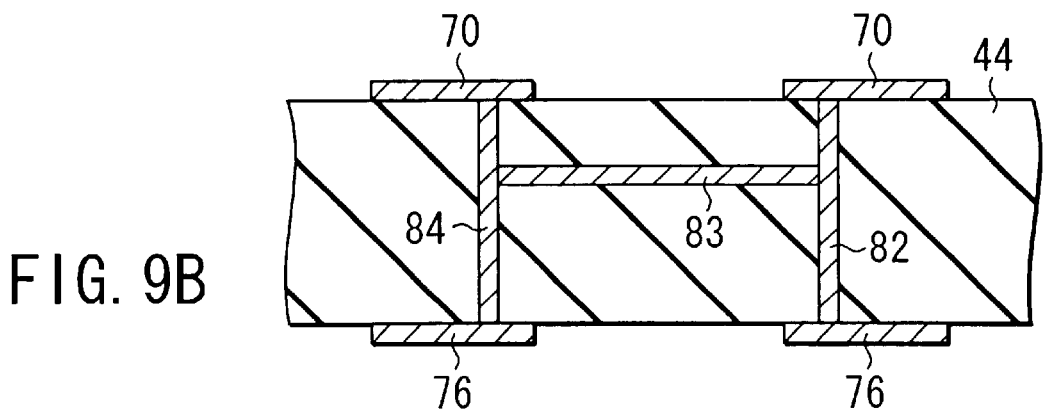
FIG. 9B is a sectional view showing in an enlarged state a part of FIG. 9A.

FIG. 9B is a view showing in an enlarged state a portion of the contact board 44 shown in FIG. 9A. The plurality of electrode pads 70 arranged on the surface of the contact board 44 constituted of a printed board and a plurality of signal pads 76 arranged on the rear surface thereof are connected with the conductors 82 and 84 in the through-hole. A wiring pattern 83 is provided between the conductors 82 and 84 in the through-hole. In this manner, an arbitrary electrode pad arranged on the surface of the contact board 44 and an arbitrary signal pad arranged on the rear surface of the contact board 44 can be connected by mutually connecting the conductors 82 and 84 in the through-hole with the wiring pattern 83. Consequently, in the case where the location of the signal pin of the semiconductor device is changed, the device can correspond to such change by changing the connection position of the signal pad and the electrode pad of the contact board 44 by the wiring pattern. Furthermore, the device can correspond to the power source pin in a similar manner.

Figure 9C:
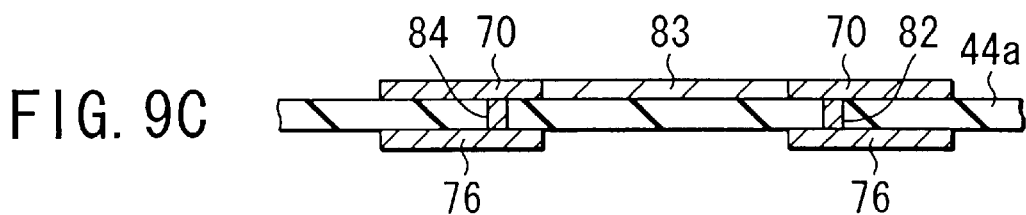
FIG. 9C is a sectional view showing another embodiment of FIG. 9B.

FIG. 9C is a view showing a case in which the contact board 44 is constituted of a film or a sheet-like member 44a. On the surface of the member 44a, a plurality of electrode pads 70 are formed and a plurality of signal pads 76 are formed on the rear surface thereof. The electrode pads 70 and the signal pads 76 are connected with conductors 82 and 84 in the through-hole respectively. On the surface of the member 44a, a wiring pattern 83 is formed which connects the electrode pad 70 and the electrode pad 70. The wiring pattern 83 may be formed on the rear surface of the member 44a. However, it is required that the wiring pattern 83 is arranged at a location where other electrode pad and the power source pad are not short-circuited via the anisotropic conductive sheet.

According to the second embodiment, the signal pin, the ground pin, the power source pin of the semiconductor device 47 and the signal pad 51, the ground pad 52, and the power source pads 53 through 56 of the connection portion 42 on the test board 41 are connected via the contact board 44, the anisotropic conductive sheets 45 and 43. On the above connection portion 42, the ground pad 52 and the power source pads 53 through 56 are arranged on the periphery of the signal pad 51. On the contact board 44, the ground pad 77 and a plurality of power source pads 78 through 81 and 78a through 81a are arranged on the periphery of the signal pad 76. The ground pad 77 and the electrode pad 71 connected to the ground pin of the semiconductor device 47 are connected with the wiring pattern while the power source pads 78 through 81 and the electrode pads 72 through 75 connected to the power source pin of the semiconductor device 47 are connected with the wiring pattern. Consequently, in the case where the pin arrangement of the semiconductor device to be measured is changed, the device can correspond to such change only by changing the contact board 44. Consequently, it is not required to manufacture the test board dedicated to the semiconductor device so that the cost can be largely decreased.

Besides, since the contact board 44 is small as compared with the test board, the conservation space can be decreased.

Furthermore, the anisotropic conductive sheets 43 and 45 have a thickness of about 1 mm, and the contact board 44 has a thickness of about 3 mm. Consequently, the distance from the semiconductor device 47 to the test board can be largely reduced as compared with the conventional example. Thus, the impedance included in wiring, particularly, the inductance thereof can be decreased as compared with the conventional example. Thus, since the transmission delay of signal is extremely small, a high-speed test can be carried out.

Furthermore, in the case where a film or a sheet-like member 44a is used as the contact board 44, the thickness of the member 44a can be set to about 50 µm. Consequently, the inductance thereof can be decreased, and a high-speed test can be carried out.

Incidentally, in the second embodiment, the connection portion 42 of the test board 41, the semiconductor device 47, and the contact board 44 can be electrically contacted with each other, it is also possible to omit the anisotropic conductive sheets 43 and 45.

Third Embodiment

A third embodiment is applied in a tester for a semiconductor device wherein a test facilitation circuit such as, for example, JTAG (Joint Test Action Group) cells, memory BIST (Built in Self Test) cells or the like is not incorporated in the inside of the LSI.

Generally, in the semiconductor device in which a test facilitation circuit such as JTAG cells, memory BIST cells or the like is not incorporated inside, the test facilitation circuits are arranged on the test board in the case where a function test using the JTAG and memory BIST are carried out.

Figure 10:
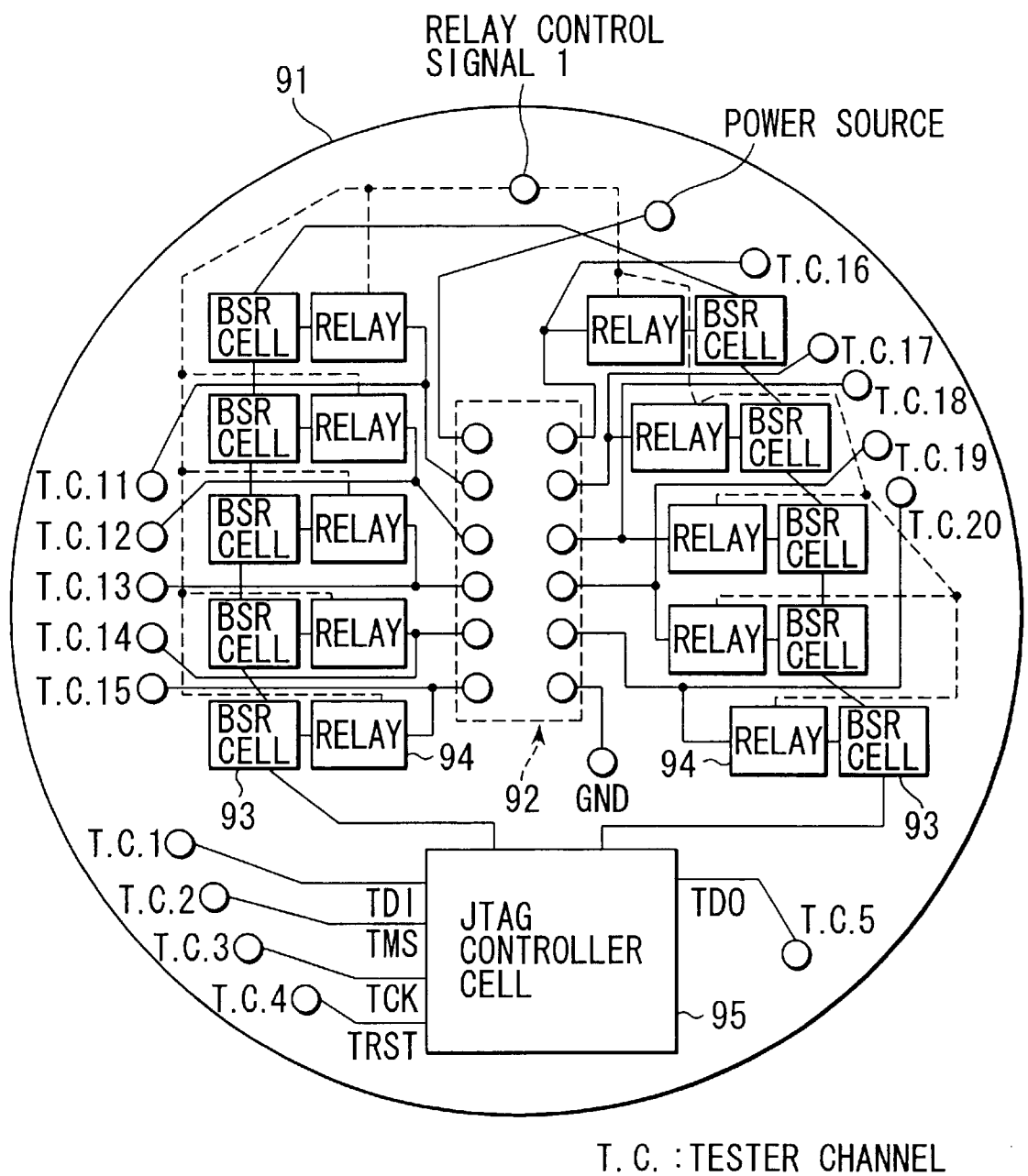
FIG. 10 is a plan view showing one example of a general test board.
Figure 11:
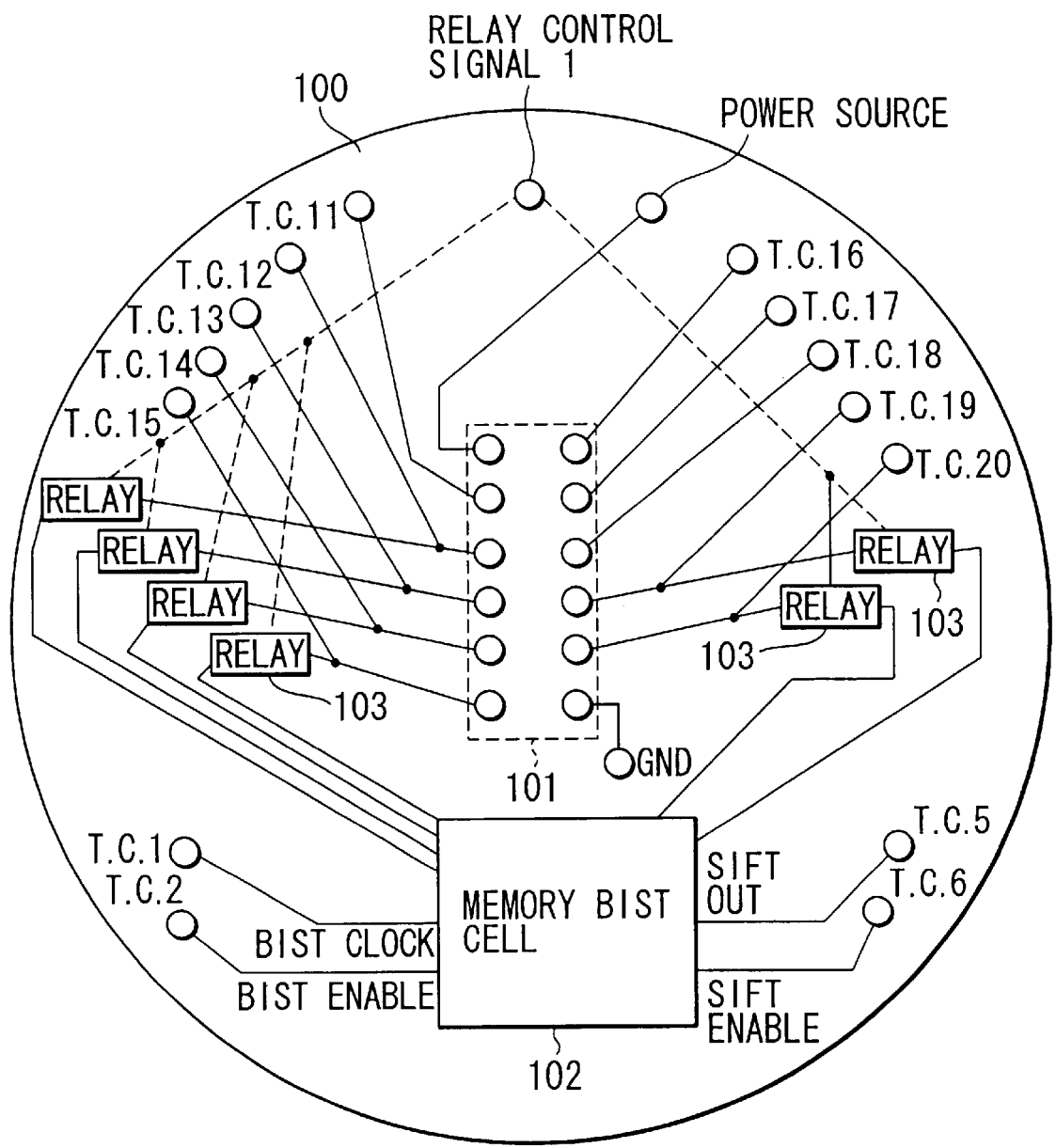
FIG. 11 is a plan view showing another example of the general test board.

FIG. 10 is a view showing a test board in which the test facilitation circuit concerning the general JTAG is arranged. FIG. 11 is a view showing a test board in which the test facilitation circuit concerning the general memory BIST is arranged.

In FIG. 10, on the central portion of the test board 91, a socket 92 is provided for attaching the semiconductor device. A plurality of BSR (Boundary Scan Register) cells 93, a plurality of relays 94 for connecting the BSR cells 93 to the semiconductor device to be measured and for separating the cells 93 from the semiconductor device, a JTAG controller cell 95 and the like are arranged on the periphery of this socket 92.

Furthermore, in FIG. 11, on the central portion of the test board 100, a socket 101 is provided for attaching the semiconductor device. In the vicinity of the socket 101, the memory BIST cell 102, a plurality of relays 103 and the like are arranged.

It is required that these test boards 91 and 100 are manufactured in accordance with the semiconductor device, and the cost has increased. Besides, a large space must be secured for the conservation of the test board.

Therefore, in the third embodiment, there is provided a tester for the semiconductor device wherein the test facilitation circuit is not incorporated in the inside of the LSI.

Figure 12:
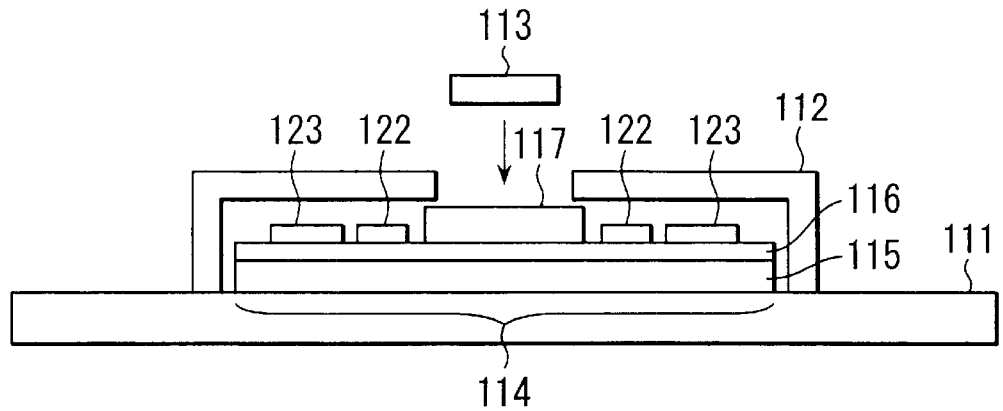
FIG. 12 is a structure view showing a third embodiment of the present invention.

FIG. 12 is a view showing the third embodiment of the present invention. A socket 112 is provided on the test board 111. In this socket 112, the semiconductor device 113 to be measured is attached. On the test board 111 located inside of the socket 112, a connection portion 114 having a plurality of pads not shown is provided. An intermediate board 116 is provided via the anisotropic conductive sheet 115. On the intermediate board 116, a plurality of electrode pads described later and a test facilitation circuit concerning JTAG or a test facilitation circuit concerning the memory BIST are arranged. On the intermediate board 116, an anisotropic conductive sheet 117 is provided on the intermediate board 116. The semiconductor device 113 is attached on this anisotropic conductive sheet 117.

Figure 13:
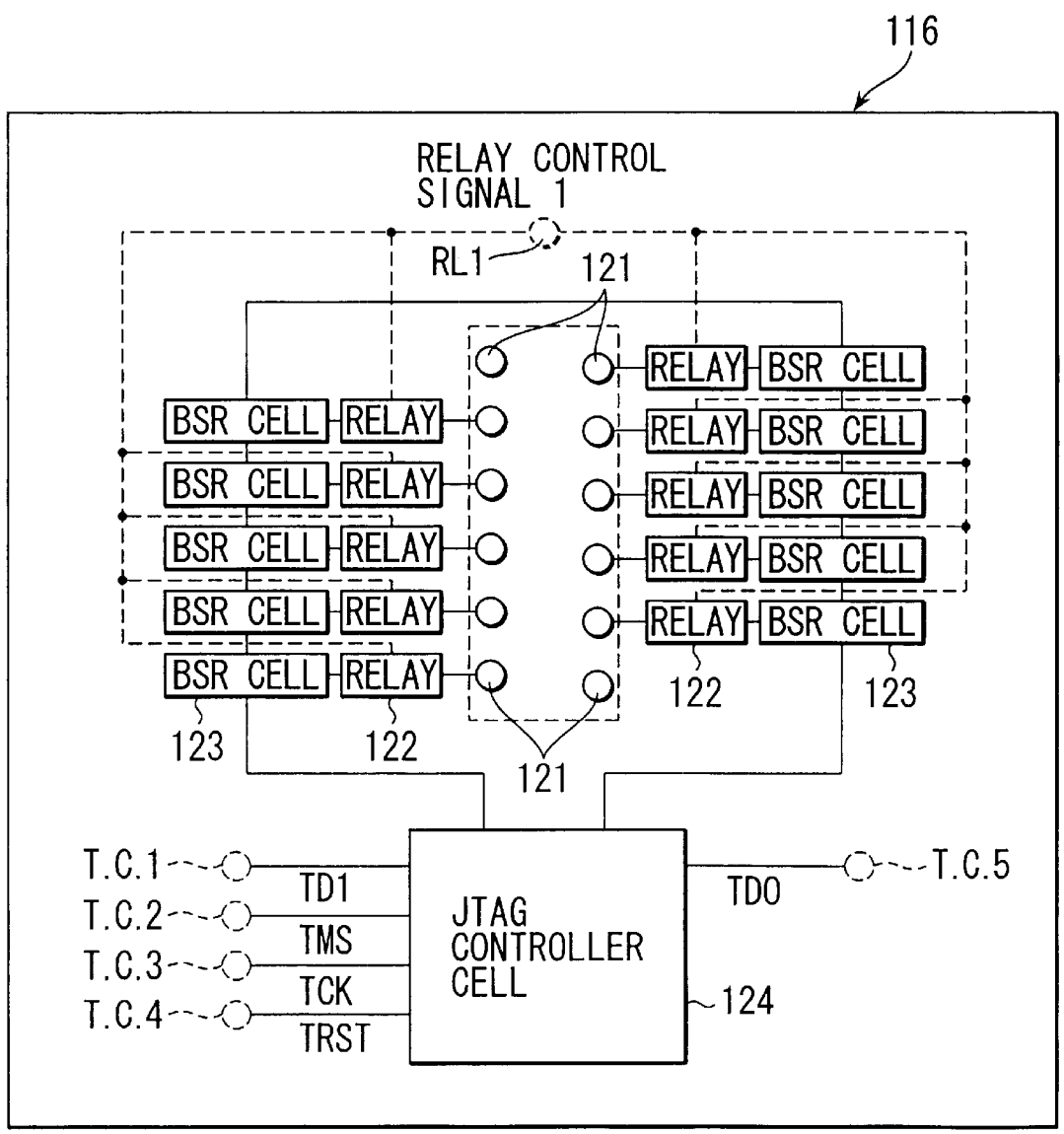
FIG. 13 is a plan view showing an essential part of FIG. 12.

FIG. 13 is a view showing one example of the intermediate board 116. On this intermediate board 116, for example, the test facilitation circuit concerning the JTAG is arranged. That is, to the surface of the intermediate board 116, approximately on the central portion thereof, a plurality of electrode pads 121 to which a pin of the semiconductor device 113 is connected are arranged. To these electrode pads 121, the BSR cell 123 is connected via the relay 122, respectively. Furthermore, in the vicinity of the electrode pads 121, the JTAG controller cell 124 is arranged. The dedicated terminals TD1, TMS, TCK, TRST, and TDO of the JTAG controller cell 124 are connected to the electrode pads T.C.1 through T.C.5 for the tester channel respectively. Besides, the plurality of relays 122 are connected to the electrode pad RL1 for supplying the relay control signal. These electrode pads T.C.1 through T.C.5 and the electrode pad RL1 are arranged on the rear surface of the intermediate board 116. Furthermore, the electrode pad 121 is provided on both the surface and the rear surface of the intermediate board 116. The electrode pads provided on the surface and the rear surface thereof are electrically connected via the conductor in the through-hole.

Figure 14:
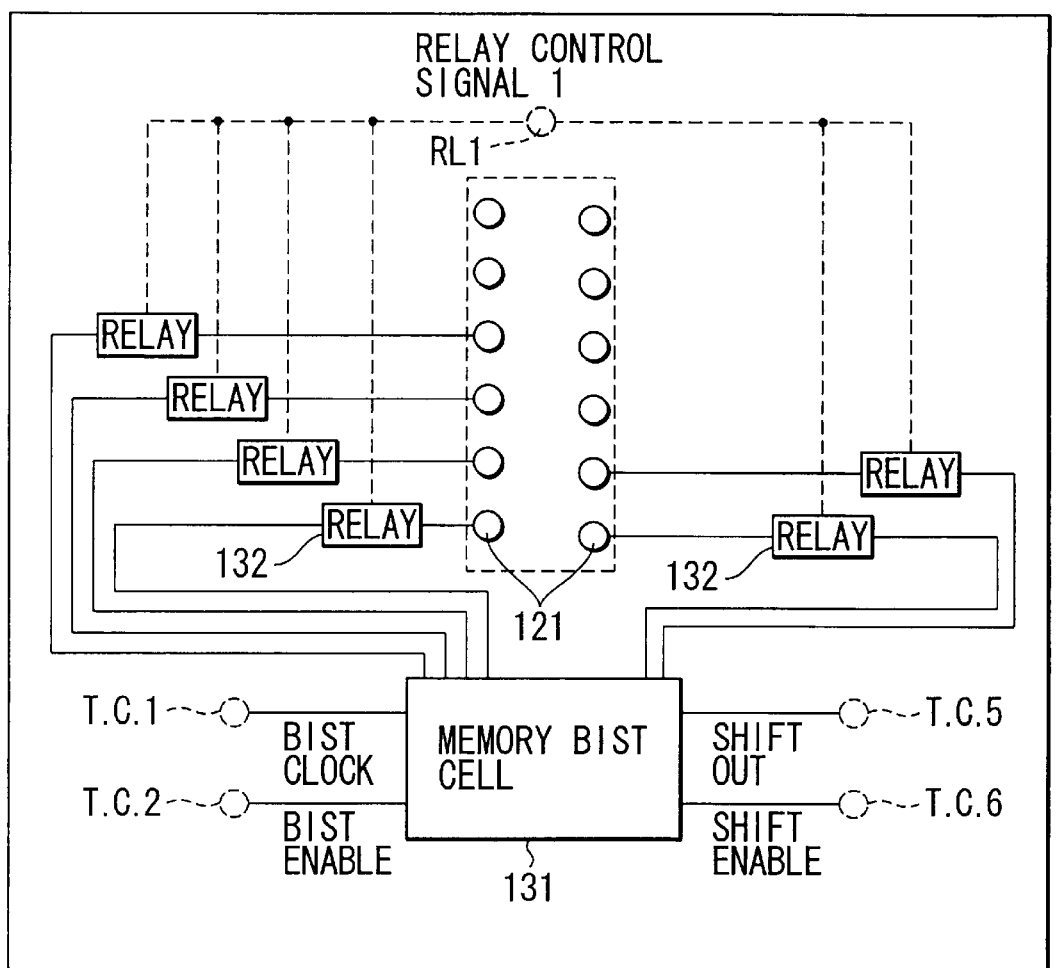
FIG. 14 is a plan view showing an essential part of FIG. 12.

Furthermore, FIG. 14 is a view showing another example of the intermediate board 116. On the intermediate board 116, for example, a test facilitation circuit concerning the memory BIST is arranged. That is, on the surface of the intermediate board 116, at the central portion thereof, a plurality of electrode pads 121 to which the pins of the semiconductor device 113 are connected are arranged. In the vicinity of the electrode pads 121, the memory BIST cell 131 is arranged. A plurality of relays 132 are arranged between the memory BIST cell 131 and the predetermined electrode pad 121. Four dedicated terminals of the memory BIST cell 131 are connected to the electrode pads T.C.1, T.C.2, T.C.5 and T.C.6 for the tester channel respectively. Furthermore, the plurality of relays 132 are connected to the electrode pad RL1 for supplying the relay control signal. These electrode pads T.C.1, T.C.2, T.C.5 and T.C.6 and the electrode pad RL1 are arranged on the rear surface of the intermediate board 116. The electrode pad 121 is provided on the surface and the rear surface of the intermediate board 116. Furthermore, the electrode pad 121 is provided on the surface and the rear surface of the intermediate board 116, and the electrode pads provided on the surface and the rear surface thereof are electrically connected via the conductor in the through-hole.

The positions of the electrode pads T.C.1 through T.C.6 and the electrode pad RL1 are common among the intermediate board 116.

Figure 15:
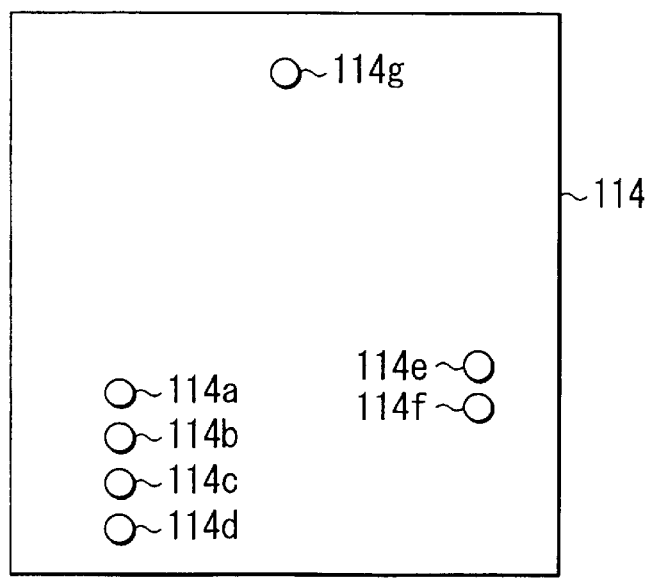
FIG. 15 is a plan view showing an essential part of FIG. 12.

FIG. 15 is a view showing a structure of the connection portion 114. This connection portion 114 has electrode pads 114a through 114g connected to the electrode pads T.C.1 through T.C.6 and the electrode pad RL1.

In the above structure, as shown in FIG. 12, when the semiconductor device 113 is attached in the socket 112, the pin of the semiconductor device 113 is connected to the electrode pad 121 on the intermediate board 116 via the anisotropic conductive sheet 117. Furthermore, the electrode pads T.C1 through T.C5 and the electrode pad RL1 on the intermediate board 116, or the electrode pads T.C.1, T.C.2, T.C.5 and T.C.6 and the electrode pad RL1 are connected to the corresponding pads out of the electrode pads 114a through 114g of the connection portion 114. In this state, a predetermined test is carried out.

According to a third embodiment, the intermediate board 116 is arranged on the test board 111 via the anisotropic conductive sheet 115, and the semiconductor device 113 is attached on the intermediate board 116 via the anisotropic conductive sheet 117. Besides, a test facilitation circuit concerning the JTAG, or a test facilitation circuit concerning the memory BIST is arranged on the intermediate board 116 while the electrode pads T.C.1 through T.C.6 and RL1 connected to the above circuits are arranged on the connection portion 114 of the test board 111. The electrode pads 114a through 114g connected to the electrode pads T.C.1 through T.C.6 and RL1 are arranged on the connection portion 114 of the test board 111. Consequently, it is possible to add these test facilitation circuits to the semiconductor device in which no test facilitation circuits are incorporated such as the JTAG cell and the memory BIST cell by replacing the intermediate board 116. Consequently, since it is not required to manufacture a dedicated test board having a test facilitation circuit like the prior art, it becomes possible to decrease the cost as compared with the prior art.

Besides, since the intermediate board 116 is small in size, the conservation space can be decreased.

Incidentally, in the third embodiment, when electric contact is enabled between the connection portion 114 of the test board 111, the semiconductor device 113, and the intermediate board 116, it is possible to omit the anisotropic conductive sheets 115 and 117.

Further, it is difficult to test an LSI having 600 signal pins containing 200 output pins by an LSI tester having a tester channel for 512 pins. For this reason, it is required that as for 88 output pins and other output pins the tester channel is shared. In order to realize this, an LSI having the function which changes the 88 output pins and other output pins is arranged on an intermediate board. According to the structure, the LSI having more signal pins than the number of channels of the LSI tester can be tested at high speed.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A tester for a semiconductor device comprising:

a test board having a first electrode pad, a first power source pad and a second power source pad, the first electrode pad being arranged in correspondence to a signal pin of the semiconductor device, the first and the second power source pads being arranged in separation from the first electrode pad;

a first intermediate board having a third power source pad, a fourth power source pad and a first hole, the third power source pad corresponding to the first power source pin of the semiconductor device, the fourth power source pad being electrically connected to the third power source pad and corresponding to the first power source pad of the test board, the first hole corresponding to the second power source pin of the semiconductor device;

a second intermediate board having a fifth power source pad, a sixth power source pad and a second hole, the fifth power source pad being arranged between the first intermediate board and the test board and being in correspondence to the second power source pin of the semiconductor device, the sixth power source pad being electrically connected to the fifth power source pad and being in correspondence to the second power source pad of the test board, the second hole being in correspondence to the fourth power source pad;

a first conductive sheet arranged between the first intermediate board and the semiconductor device, the first conductive sheet electrically connecting the first power source pin of the semiconductor device and the third power source pad of the first intermediate board;

a second conductive sheet arranged between the first intermediate board and the second intermediate board, the second conductive sheet electrically connecting the second power source pin of the semiconductor device and the fifth power source pad of the second intermediate board via the first hole of the first intermediate board and the first conductive sheet; and a third conductive sheet arranged between the second intermediate board and the test board, the third conductive sheet electrically connecting the sixth power source pad of the second intermediate board and the second power source pad of the test board, and electrically connecting the fourth power source pad of the first intermediate board and the first power source pad of the test board via the second hole of the second intermediate board and the second conductive sheet.

2. The tester according to claim 1, wherein the first intermediate board has a third hole corresponding to a signal pin of the semiconductor device and the second intermediate board has a fourth hole corresponding to the signal pin of the semiconductor device.

* * * * *